United States Patent
Gwak et al.

(10) Patent No.: US 9,472,708 B2
(45) Date of Patent: Oct. 18, 2016

(54) METHOD OF FABRICATING COPPER INDIUM GALLIUM SELENIDE (CIGS) THIN FILM FOR SOLAR CELL USING SIMPLIFIED CO-VACUUM EVAPORATION AND COPPER INDIUM GALLIUM SELENIDE (CIGS) THIN FILM FOR SOLAR CELL FABRICATED BY THE SAME

(71) Applicant: KOREA INSTITUTE OF ENERGY RESEARCH, Daejeon (KR)

(72) Inventors: Jihye Gwak, Daejeon (KR); Jae-Ho Yun, Daejeon (KR); SeJin Ahn, Daejeon (KR); Kyung Hoon Yoon, Daejeon (KR); Kee Shik Shin, Daejeon (KR); Guk-Yeong Jeong, Seoul (KR); SeoungKyu Ahn, Daejeon (KR); Ara Cho, Seoul (KR); Hisun Park, Gyeonggi-do (KR); Sung Woo Choi, Seoul (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 210 days.

(21) Appl. No.: 14/364,876

(22) PCT Filed: Feb. 5, 2013

(86) PCT No.: PCT/KR2013/000922
§ 371 (c)(1),
(2) Date: Jun. 12, 2014

(87) PCT Pub. No.: WO2013/119024
PCT Pub. Date: Aug. 15, 2013

(65) Prior Publication Data
US 2014/0326317 A1 Nov. 6, 2014

(30) Foreign Application Priority Data
Feb. 7, 2012 (KR) .......... 10-2012-0012466

(51) Int. Cl.
*B05D 5/12* (2006.01)
*H01L 31/18* (2006.01)
*H01L 31/032* (2006.01)

(52) U.S. Cl.
CPC .......... *H01L 31/18* (2013.01); *H01L 31/0322* (2013.01); *Y02E 10/541* (2013.01); *Y02P 70/521* (2015.11)

(58) Field of Classification Search
USPC ............................................ 427/74
See application file for complete search history.

(56) References Cited

U.S. PATENT DOCUMENTS

| | | | | |
|---|---|---|---|---|
| 2011/0048524 A1* | 3/2011 | Nam | .......... | H01L 31/0322 136/256 |
| 2013/0074933 A1* | 3/2013 | Chou | .......... | H01L 31/0322 136/260 |

FOREIGN PATENT DOCUMENTS

| | | |
|---|---|---|
| CN | 102237439 A | 11/2011 |
| JP | 2006-307278 | * 11/2006 |

(Continued)

OTHER PUBLICATIONS

Kessler et al., "Cu(IN,Ga)Se2 thin films grown with a cu-poor/rich/poor sequence: growth model and structural considerations" (2003).*
machine translation for JP 2006-307278.*
International Search Report dated May 16, 2013 for corresponding International Patent Application No. PCT/KR2013/000922, filed Feb. 5, 2013.

(Continued)

*Primary Examiner* — Austin Murata
(74) *Attorney, Agent, or Firm* — Westman, Champlin & Koehler, P.A.; Amanda M. Prose

(57) ABSTRACT

A method of fabricating a CIGS thin film for solar cells using a simplified co-vacuum evaporation process and a CIGS thin film fabricated by the method are disclosed. The method includes: (a) depositing Cu, Ga and Se on a substrate having a substrate temperature ranging from 500° C. to 600° C. through co-vacuum evaporation, (b) depositing Cu, Ga, Se and In through co-vacuum evaporation while maintaining the same substrate temperature as in step (a), and (c) depositing Ga and Se through co-vacuum evaporation, followed by depositing Se alone through vacuum evaporation while lowering the temperature of the substrate. The method can realize crystal growth and band-gap grading by Ga composition distribution while simplifying process steps and significantly reducing a film-deposition time, as compared with a conventional co-vacuum evaporation process, thereby providing improvement in process efficiency.

7 Claims, 10 Drawing Sheets

(56) References Cited

FOREIGN PATENT DOCUMENTS

| JP | 2006-307278 A | 11/2006 |
| JP | 2011-060891 A | 3/2011 |
| JP | 2012-15314 A | 1/2012 |
| KR | 10-2007-0015538 A | 2/2007 |
| KR | 10-2010-0075336 A | 7/2010 |
| KR | 10-2011-0055830 A | 5/2011 |

OTHER PUBLICATIONS

Chinese Office Action dated Aug. 28, 2015 issued in the family Chinese patent application No. 201380004292.X.
International Preliminary Report on Patentability dated Aug. 12, 2014 issued in related PCT application No. PCT/KR2013/000922.

* cited by examiner (a)

(b)

METHOD OF FABRICATING COPPER INDIUM GALLIUM SELENIDE (CIGS) THIN FILM FOR SOLAR CELL USING SIMPLIFIED CO-VACUUM EVAPORATION AND COPPER INDIUM GALLIUM SELENIDE (CIGS) THIN FILM FOR SOLAR CELL FABRICATED BY THE SAME

CROSS-REFERENCE TO RELATED APPLICATION(S)

This Application is a 371 National Stage Application of International Application No. PCT/KR2013/000922, filed on Feb. 5, 2013, published as International Publication No. WO 2013/119024; and which claims priority to and the benefit of Korean Patent Application No. 10-2012-0012466, filed on Feb. 7, 2012.

BACKGROUND

1. Technical Field

The present invention relates to a method of fabricating a copper indium gallium selenide (CIGS) thin film for solar cells through co-vacuum evaporation and a CIGS thin film for solar cells fabricated by the same. More particularly, the present invention relates to a CIGS thin film for solar cells fabricated using a simplified co-vacuum evaporation process without deterioration in physical properties of crystal growth of the thin film and band-gap grading by Ga distribution while reducing process costs through simplification of process steps and adjustment of evaporation elements.

2. Description of the Related Art

Recently, importance on development of next-generation clean energy sources has increased due to the depletion of fossil fuel reserves. Thereamong, a solar cell is a device that converts solar energy directly into electricity. Solar cells can serve as an energy source to solve energy problems in the future, since they do not emit pollutants and rely upon the sun.

A solar cell may be divided into a variety of kinds depending upon materials used in a light-absorption layer, and the most currently available solar cell is a silicon solar cell. However, since silicon prices have been rising due to shortage of high purity silicon, a thin film type solar cell is drawing attention. The thin film type solar cell is fabricated to a thin thickness and thus contributes to less material consumption and light weight, thereby providing a wide application range. Studies have been actively made as to amorphous silicon, CdTe, CIS or CIGS as a material for such a thin film solar cell.

CIS or CIGS is a I-III-VI compound semiconductor material and has higher conversion efficiency than any other thin-film solar cell materials experimentally prepared. Particularly, since the CIS or CIGS can be fabricated to a thin thickness of 10 microns or less and can be stably operated even after long term use, the CIS or CIGS is expected to be a low-cost, high-efficiency solar cell material as an alternative to silicon.

Particularly, a CIS thin film is a direct transition type semiconductor that can be made thinner, is suitable for optical-conversion due to a band-gap of 1.04 eV, and exhibits high optical-absorption coefficient. CIGS is an alternative to CIS in which a portion of In is substituted with Ga or Se is substituted with S in order to improve low open circuit voltage of CIS.

A CIGS thin film can be generally fabricated by vacuum deposition or non-vacuum coating. Particularly, vacuum deposition may include co-evaporation, in-line evaporation, a two-step process (precursor-reaction), and the like. Thereamong, co-evaporation has been traditionally used to fabricate a high-efficiency CIGS thin-film solar cell. However, co-evaporation has a problem of difficulty in commercialization due to a complicated process and difficulty in fabrication of a large area solar cell. To solve this problem, a two-step (deposition/selenization) process facilitating mass production has been developed.

Among current CIGS deposition processes, a high efficiency technique having an efficiency of 20% or more is a three-step co-vacuum evaporation process developed by NREL wherein, in a first step, In, Ga, and Se are deposited, in a second step, Cu and Se are deposited excessively relative to a normal amount to promote crystal growth, and in a third step, In, Ga, and Se are further supplied to a thin film to adjust a composition of the CIGS thin-film. Particularly, a Cu—Se compound formed in the second step has a low melting point of about 523° C. or less, thereby causing crystal growth of the CIGS thin-film through induction of liquid-phase sintering of the compound. Thus, it has been known that a V-type distribution of Ga in the composition of the thin-film is obtained through such a three-step process, thereby providing efficiency improvement through band-gap grading.

However, considering mass production, since regulation of flux of elements in each step is complex and thin-film deposition requires a long time, the three-step process has a drawback of high process cost. Therefore, there is a need for a method of fabricating a CIGS thin film for solar cells through a simplified process capable of realizing crystal growth and band-gap grading by Ga composition distribution, while simplifying process steps and significantly reducing a film-deposition time.

BRIEF SUMMARY

The present invention has been conceived to solve such problems in the related art, and an object of the present invention is to provide a method of fabricating a copper indium gallium selenide (CIGS) thin film for solar cells using a simplified co-vacuum evaporation process capable of realizing crystal growth and band-gap grading by Ga composition distribution, while simplifying process steps and significantly reducing a film-deposition time, as compared with a conventional co-vacuum evaporation process.

In accordance with one aspect of the present invention, a method of fabricating a copper indium gallium selenide (CIGS) thin film for solar cells using a simplified co-vacuum evaporation process includes: (a) depositing Cu, Ga and Se on a substrate having a substrate temperature ranging from 500° C. to 600° C. through co-vacuum evaporation; (b) depositing Cu, Ga, Se and In through co-vacuum evaporation while maintaining the same substrate temperature as in step (a); and (c) depositing Ga and Se through co-vacuum evaporation, followed by depositing Se alone through vacuum evaporation while lowering the temperature of the substrate.

In step (a), the co-vacuum evaporation may be performed for 2 minutes to 15 minutes.

In step (b), the co-vacuum evaporation may be performed for 8 minutes to 30 minutes.

In step (c), co-vacuum evaporation of Ga and Se may be performed for 10 seconds to 180 seconds.

In step (c), vacuum evaporation of Se alone may be performed until the substrate temperature is lowered to 200° C.

In accordance with another aspect of the present invention, a copper indium gallium selenide (CIGS) thin film for solar cells is fabricated by a method including: depositing Cu, Ga and Se on a substrate having a substrate temperature ranging from 500° C. to 600° C. through co-vacuum evaporation; depositing Cu, Ga, Se and In through co-vacuum evaporation while maintaining the same substrate temperature as in the former step; and sequentially depositing Ga and Se through co-vacuum evaporation, followed by depositing Se alone through vacuum evaporation while lowering the temperature of the substrate.

In accordance with a further aspect of the present invention, a solar cell includes a copper indium gallium selenide (CIGS) thin film for solar cells fabricated by a method including: depositing Cu, Ga and Se on a substrate having a substrate temperature ranging from 500° C. to 600° C. through co-vacuum evaporation; depositing Cu, Ga, Se and In through co-vacuum evaporation while maintaining the same substrate temperature as in the former step; and sequentially depositing Ga and Se through co-vacuum evaporation, followed by depositing Se alone through vacuum evaporation while lowering the temperature of the substrate.

The method of fabricating a CIGS thin film for solar cells through co-vacuum evaporation according to the present invention can realize crystal growth and band-gap grading by Ga composition distribution while simplifying process steps and significantly reducing a film-deposition time, as compared with a conventional co-vacuum evaporation process, thereby providing improvement in process efficiency.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
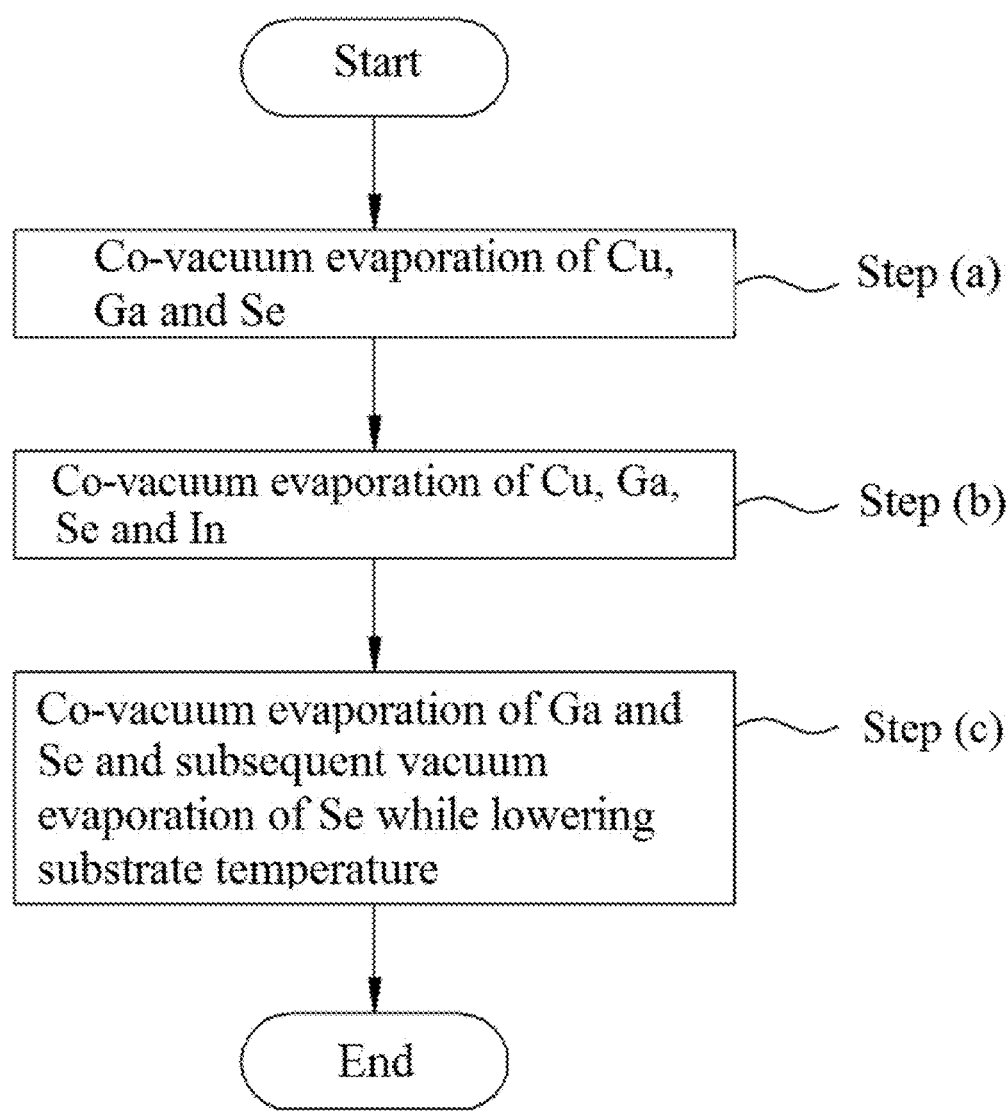
FIG. 1 is a flowchart of a procedure of fabricating a copper indium gallium selenide (CIGS) thin-film through co-vacuum evaporation according to one embodiment of the present invention.

Hereinafter, a method of fabricating a copper indium gallium selenide (CIGS) thin-film for solar cells through co-vacuum evaporation will be described with reference to FIG. 1. Referring to FIG. 1, the CIGS thin-film fabrication method may include three steps.

First, Cu, Ga and Se are deposited on a substrate having a temperature ranging from 500° C. to 600° C. through co-vacuum evaporation (step (a)).

Here, co-vacuum evaporation is preferably performed for 2 minutes to 15 minutes.

Here, since the total process time to obtain a desired thickness of the CIGS thin-film ranging from 1.0 micron to 2.5 microns ranges from 10 minutes to 40 minutes and the process time of co-vacuum evaporation preferably ranges from 20% to 40% of the total process time, i.e. 10 minutes to 40 minutes, to obtain a sufficient Ga-grading effect, the upper and lower limits of the co-vacuum evaporation time are determined based on a minimum percentage of the minimum process time and a maximum percentage of the maximum process time. Here, the total process time may vary depending upon the temperature of an effusion cell.

Next, Cu, Ga, Se and In are deposited through co-vacuum evaporation while maintaining the same substrate temperature as in step (a) (step (b)).

Here, co-vacuum evaporation is preferably performed for 8 minutes to 30 minutes.

Here, since the total process time to obtain a desired thickness of the CIGS thin-film ranging from 1.0 micron to 2.5 microns ranges from 10 minutes to 40 minutes and the process time of the co-vacuum evaporation step (a) is thus selected to be included in the total process time, the upper and lower limits of the co-vacuum evaporation time are determined based on a minimum percentage of the minimum process time and a maximum percentage of the maximum process time. Here, the total process time may vary depending upon the temperature of the effusion cell.

Finally, Ga and Se are deposited through co-vacuum evaporation by blocking supply of Cu and In for a first predetermined time, and Se is deposited alone through vacuum evaporation by blocking supply of Ga, while lowering the temperature of the substrate (step (c)).

Co-vacuum evaporation of Ga and Se is performed for 10 seconds to 180 seconds, and vacuum evaporation of Se alone is preferably performed until the substrate temperature is lowered to 200° C.

Here, the upper and lower limits of the process time of co-vacuum evaporation of Ga and Se are determined based on the total process time to obtain a desired thickness of the CIGS thin-film ranging from 1.0 micron to 2.5 microns. If the process time is less than 10 seconds, the Ga-grading effect cannot be obtained at an interface of the thin-film. Further, if the process time is longer than 180 seconds, the content of Ga excessively increases, so that the overall composition of the CIGS thin-film can greatly deviate from an optimum composition.

The deposition rate of each element in the respective steps may be controlled in response to variation in temperature of the effusion cell.

The CIGS thin-film for solar cells is fabricated by the method described above. In fabrication of the CIGS thin-film, in an initial deposition stage of Cu, Ga and Se, an excess of Cu is supplied to promote crystal growth in the thin-film and the Ga-grading effect on a Mo rear electrode can be obtained by blocking supply of In. Further, in the step of lowering the substrate-temperature, i.e. in step (c), Ga is first supplied in a small amount, thereby providing the Ga-grading effect on the surface of the thin film.

Herein, the Ga-grading effect means improved performance through increase in open circuit voltage and reduction in recombination due to increase in band-gap on the surface of a CIGS-based light-absorptive thin film for solar cells, and through improved electron mobility by increase in band gap on the rear electrode side, which are obtained by realizing a double grading band-gap through modification of band-gap by control of the Ga/(In+Ga) ratio in the CIGS thin-film.

In another aspect, the present invention provides a CIGS thin-film for solar cells fabricated by the method described above.

In a further aspect, the present invention provides a solar cell using the CIGS thin-film fabricated by the method described above.

The present invention will be described in more detail with reference to examples.

EXAMPLE 1

First, a Mo rear electrode was deposited to a thickness of about 1 μm on a soda lime glass substrate by direct current (DC) sputtering.

Next, Cu, Ga and Se were first deposited on the glass substrate at 550° C. for 10 minutes through co-vacuum evaporation, and Cu, Ga and Se were additionally deposited together with In for 20 minutes. Then, supply of Cu and In was stopped and the substrate temperature was lowered. After 100 seconds, supply of Ga was stopped. Here, the temperature of an effusion cell was set to 1470° C. for Cu, 1195° C. for In, 1180° C. for Ga, and 190° C. for Se.

Figure 2:
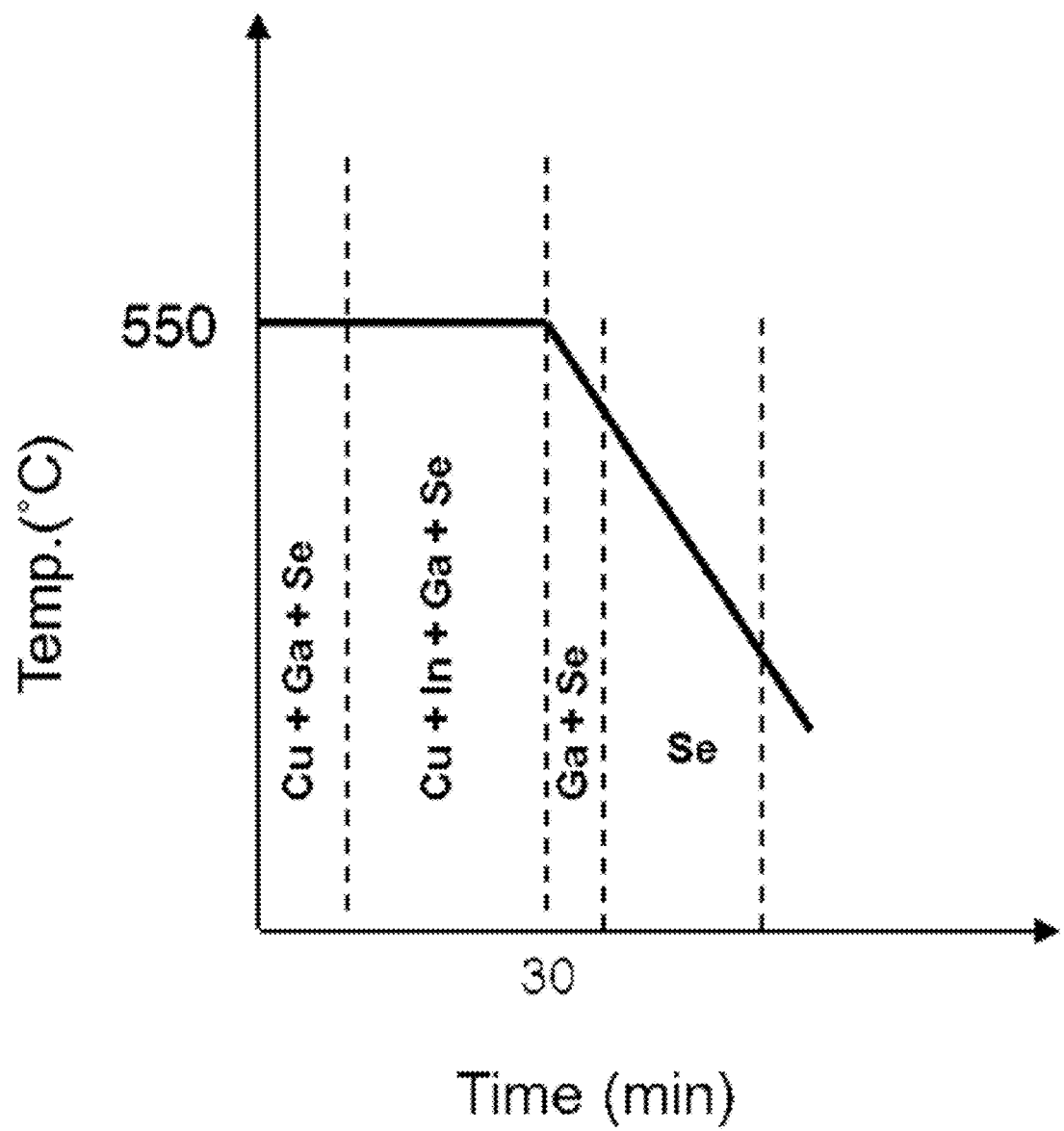
FIG. 2 is a graph depicting a process profile of a CIGS thin-film fabricated in Example 1.

A process profile of the CIGS thin-film according to Example 1 is shown in FIG. 2.

COMPARATIVE EXAMPLE 1

The same substrate as in Example 1 was prepared, and Cu, In, Ga and Se were deposited on the substrate at 550° C. for 30 minutes through co-vacuum evaporation. While lowering the substrate temperature, supply of elements other than Se was stopped. A ratio of respective elements was adjusted and optimized by controlling the temperature of an effusion cell. Here, the temperature of the effusion cell was set to 1500° C. for Cu, 1195° C. for In, 1180° C. for Ga, and 190° C. for Se.

Figure 3:
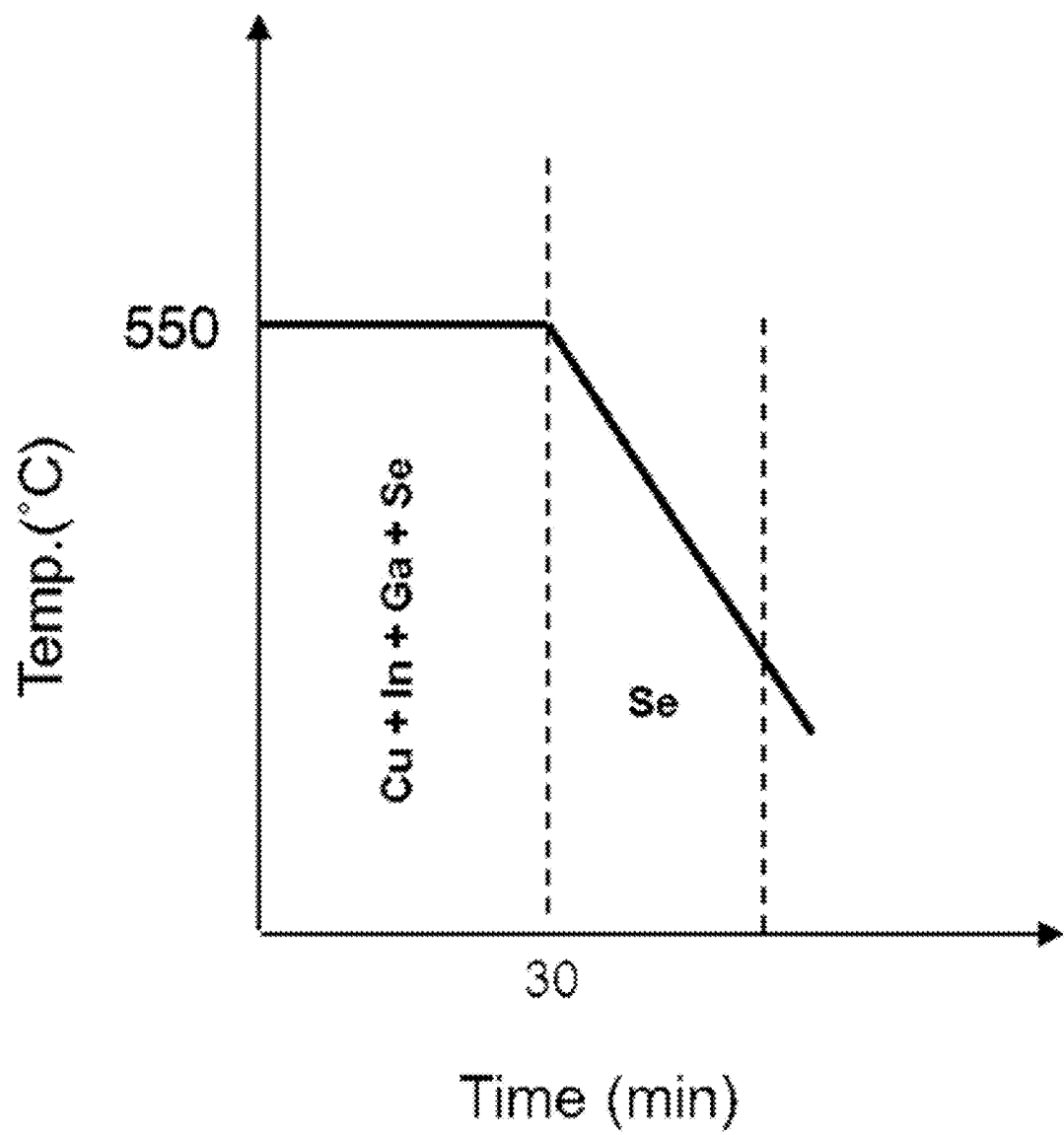
FIG. 3 is a graph depicting a process profile of a CIGS thin-film fabricated in Comparative Example 1.

The process profile of the CIGS thin-film according to Comparative Example 1 is shown in FIG. 3.

COMPARATIVE EXAMPLE 2

Comparative Example 2 relates to a method of fabricating a CIGS thin-film using a conventional three-step co-vacuum evaporation process.

First, the same substrate as in Comparative Example 1 was prepared, and In, Ga and Se were deposited on the substrate at 350° C. for 15 minutes through co-vacuum evaporation. Next, after supply of In and Ga was stopped, the substrate temperature was increased such that Cu and Se were deposited at 550° C. for 26 minutes and 30 seconds. Next, after supply of Cu was stopped, In, Ga and Se were additionally deposited for 8 minutes and 30 seconds. While lowering the substrate temperature, supply of elements other than Se was stopped. A ratio of respective elements was adjusted and optimized by controlling the temperature of an effusion cell. Here, the temperature of the effusion cell was set to 1525° C. for Cu, 1195° C. for In, 1180° C. for Ga, and 190° C. for Se.

Figure 4:
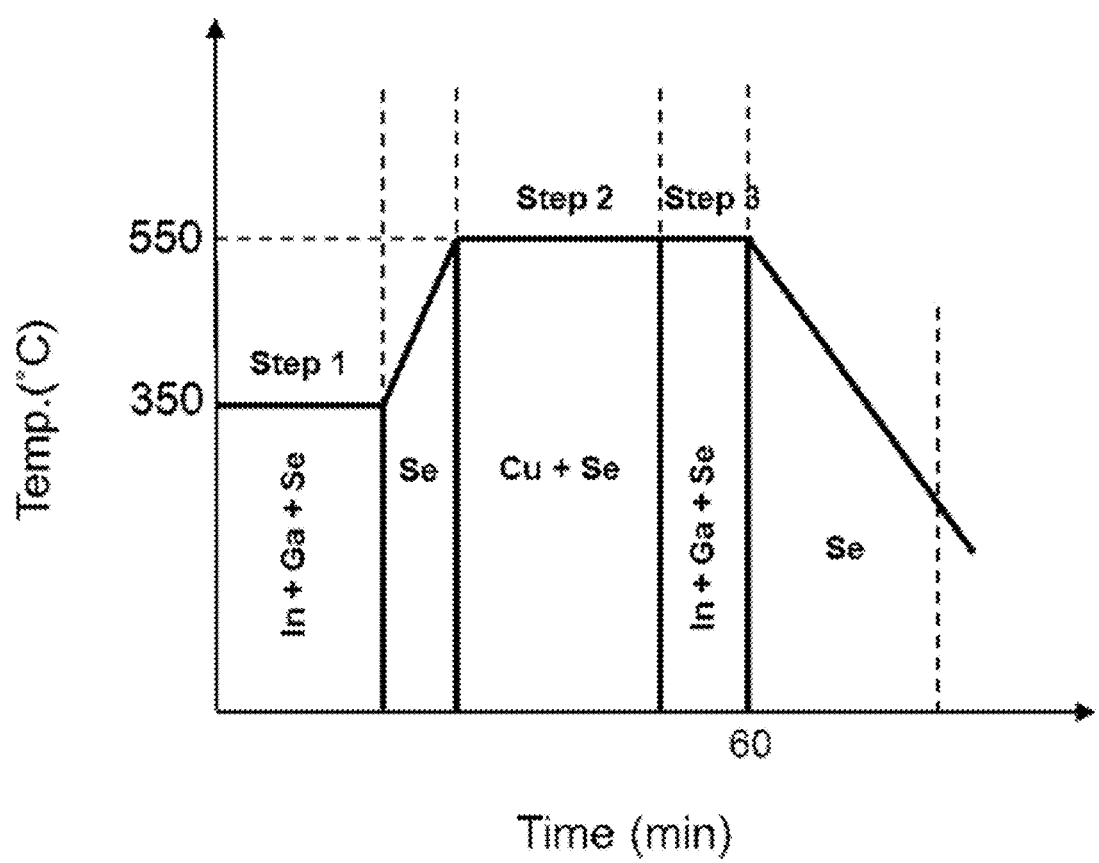
FIG. 4 is a graph depicting a process profile of a CIGS thin-film fabricated in Comparative Example 2.

The process profile of the CIGS thin-film according to Comparative Example 2 is shown in FIG. 4.

Comparative Analysis of CIGS Thin-Film Morphology

Figure 5:
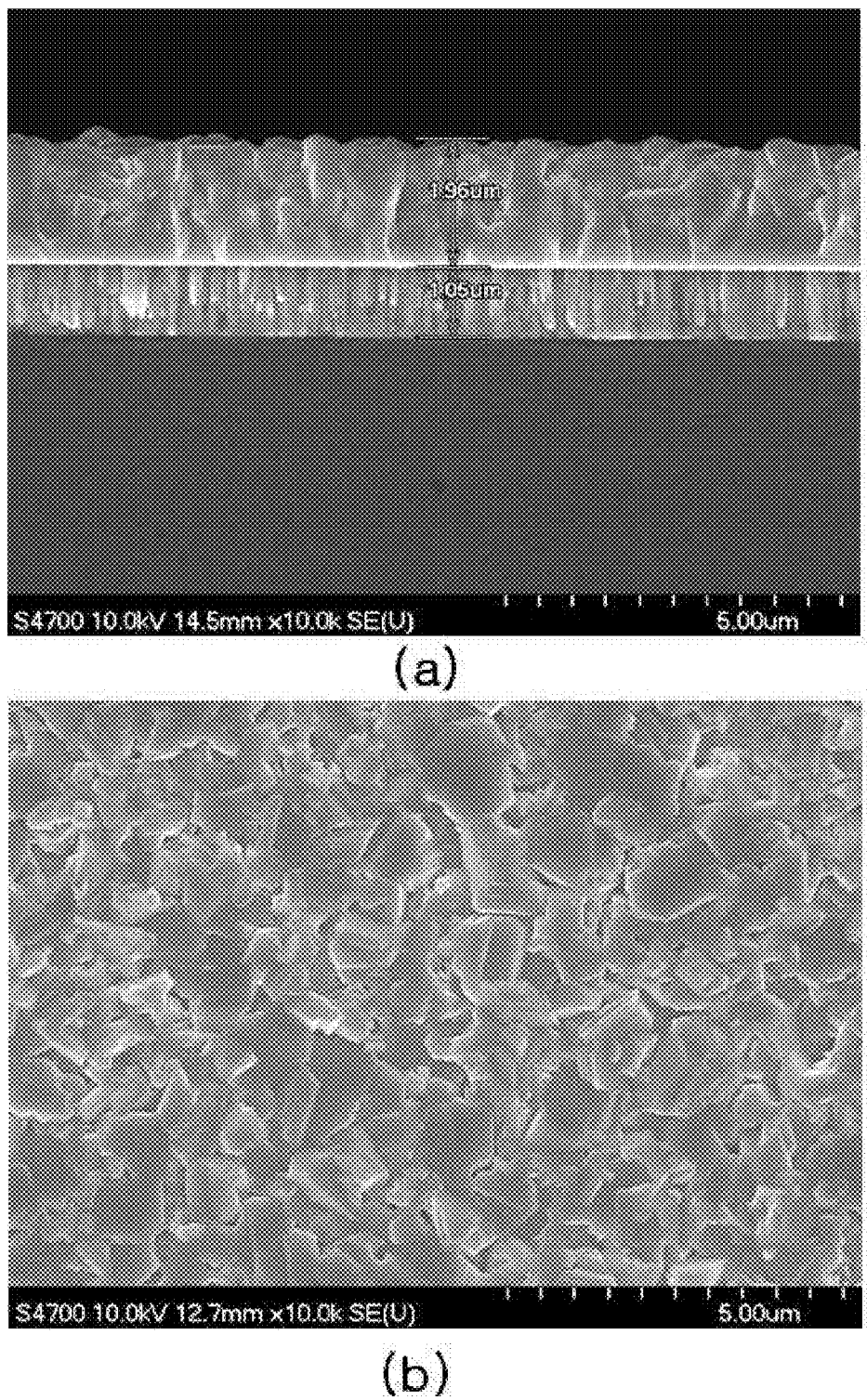
FIG. 5 shows SEM images of side and upper surfaces of the CIGS thin-film fabricated in Example 1.
Figure 6:
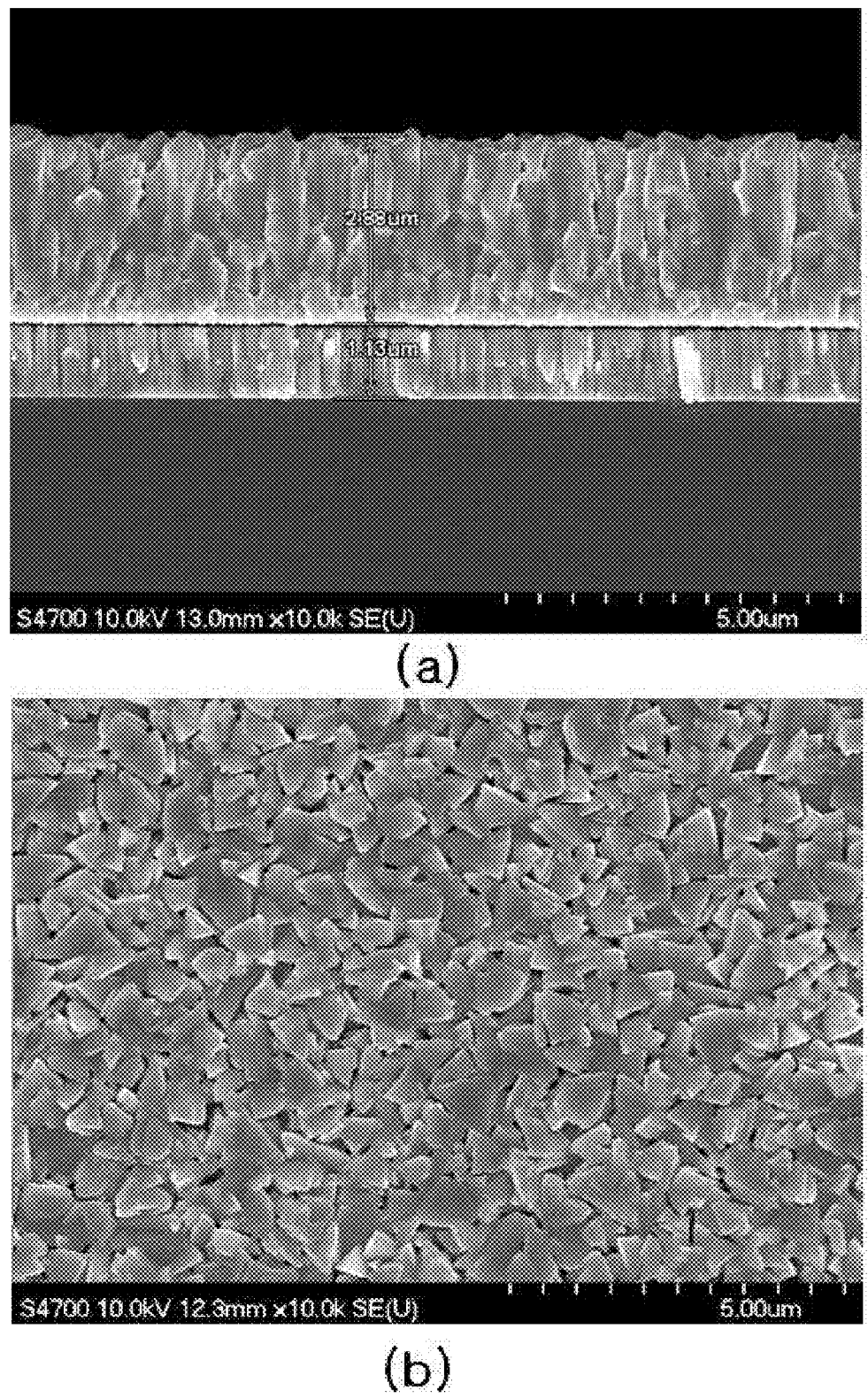
FIG. 6 shows SEM images of side and upper surfaces of the CIGS thin-film fabricated in Comparative Example 1.
Figure 7:
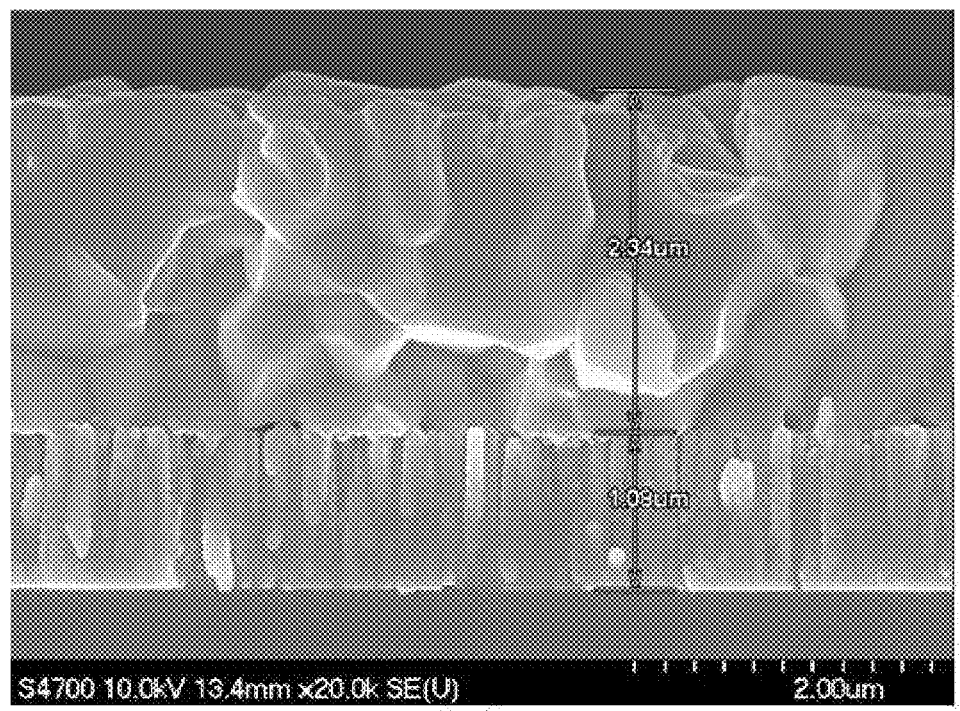
FIG. 7 shows SEM images of side and upper surfaces of the CIGS thin-film fabricated in Comparative Example 2.
Figure 7:
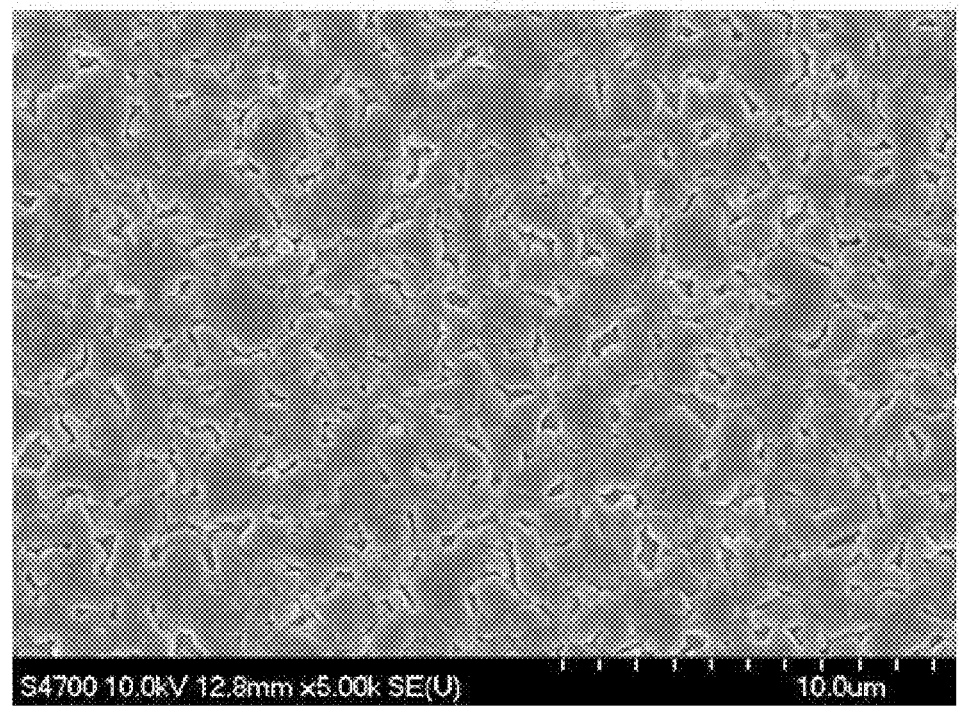

SEM images for side and upper surfaces (a and b) of the CIGS thin-films for solar cells fabricated in Example 1 and Comparative Examples 1 and 2 are shown in FIGS. 5, 6, and 7, respectively.

As compared with the structure of the CIGS thin-film of Comparative Example 1 in which Cu, In, Ga and Se were simply evaporated at a predetermined temperature, the structure of the CIGS thin-film of Example 1 shows that crystal growth was sufficiently performed and the number of vacancies in a crystal structure was very small. This structure is very similar to that of the CIGS thin-film of Comparative Example 2 that is obtained through the three-step co-vacuum evaporation process.

Conversely, the CIGS thin-film of Comparative Example 1 shows that the size of crystal grains was relatively small and there were many vacancies between grains. It is considered that this is because the CIGS thin-film of Comparative Example 1 failed to obtain a flux effect of a Cu—Se compound, which can be obtained by a conventional three-phase co-vacuum evaporation process as in Comparative Example 2.

That is, the CIGS thin-film of Example 1 shows that crystal growth in the thin-film was sufficiently performed even by a simplified process in which process-number is simplified and process time is also shortened, as compared with the conventional three-step co-vacuum evaporation process.

Figure 8:
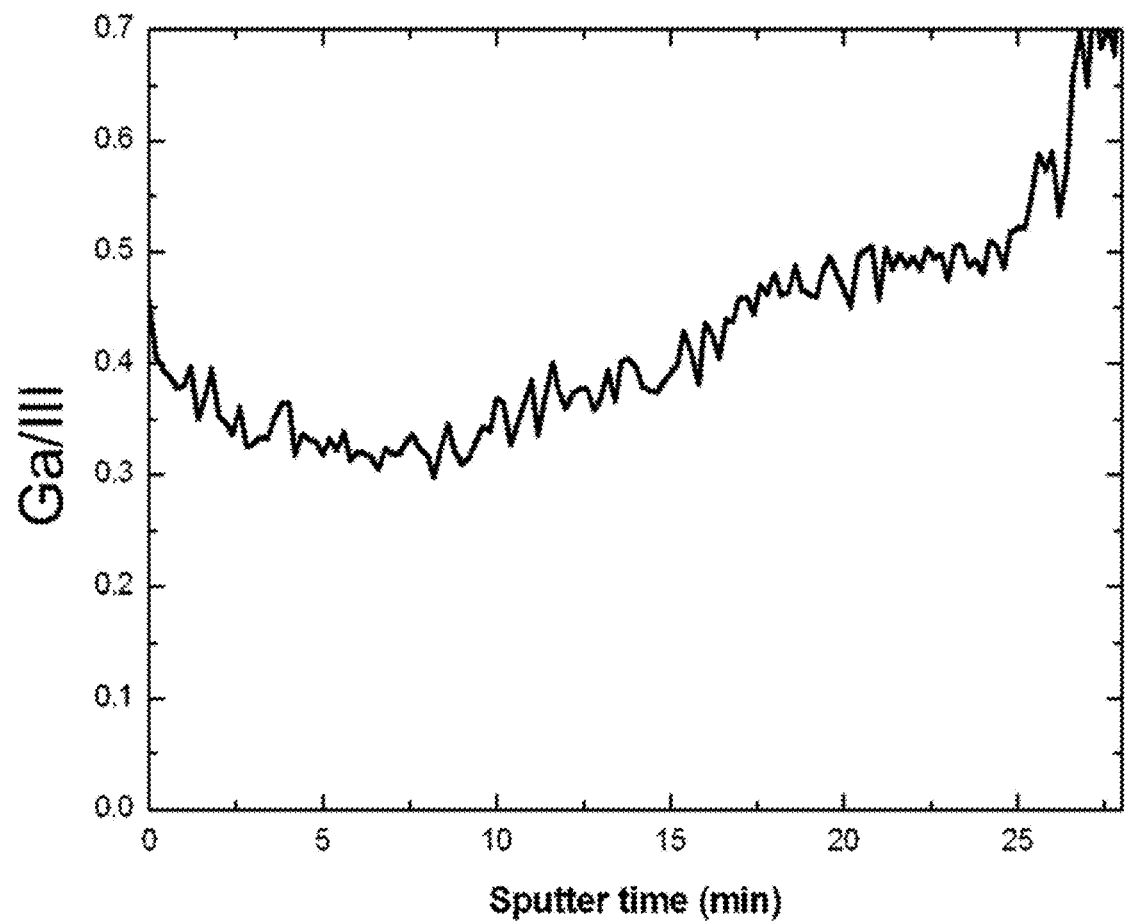
FIG. 8 is a graph depicting AES analysis results of Ga distribution in the CIGS thin-film fabricated in Example 1.
Figure 9:
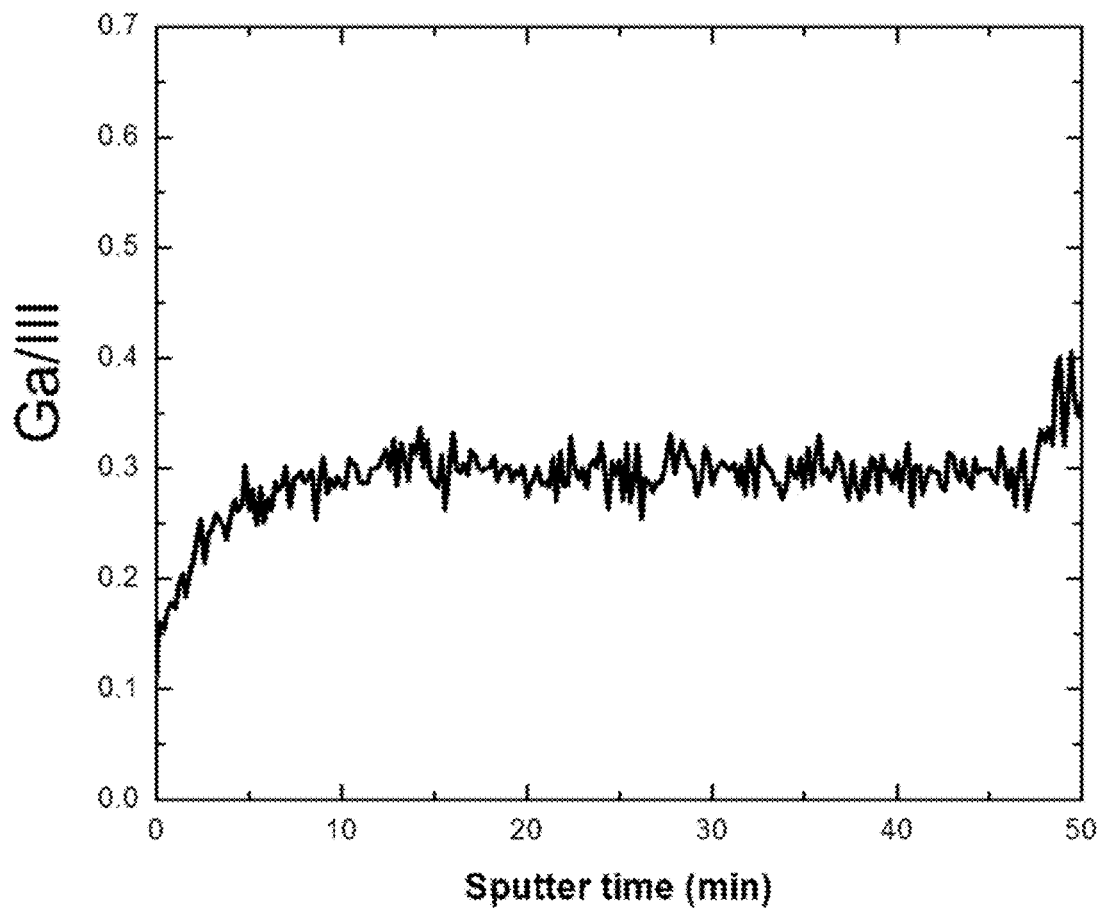
FIG. 9 is a graph depicting AES analysis results of Ga distribution in the CIGS thin-film fabricated in Comparative Example 1.
Figure 10:
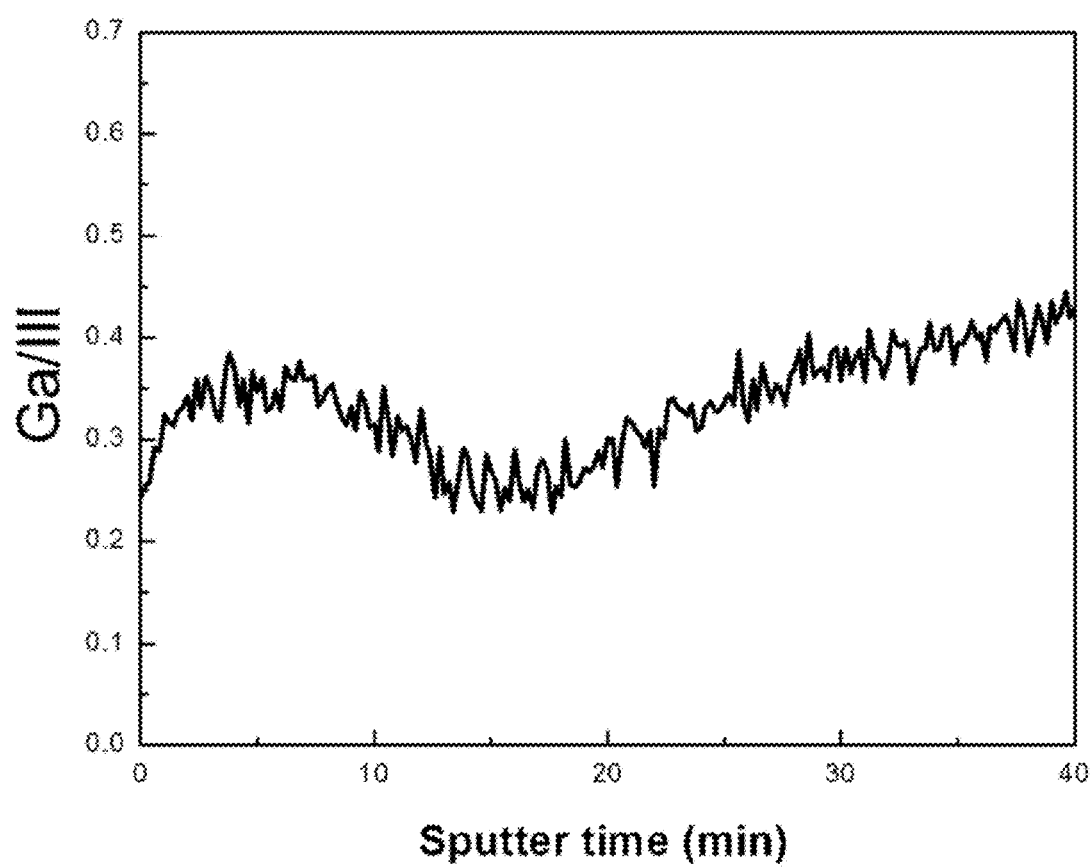
FIG. 10 is a graph depicting AES analysis results of Ga distribution in the CIGS thin-film fabricated in Comparative Example 2.

Auger Electron Spectroscopy (AES) Analysis for Ga Distribution in CIGS Thin-Film Ratios of Ga to other elements in a CIGS thin-film depending upon depth of the thin-film of Example 1, Comparative Example 2 and Comparative Example 3 are shown in FIGS. 8, 9, and 10. Here, sputtering time is proportional to a vertical distance from the surface of the CIGS thin-film.

It can be seen that Example 1 shows a V-type profile in which the surface and the Mo rear electrode exhibit a relatively high composition ratio of Ga. This profile is similar to that of Comparative Example 2 obtained by the conventional three-step co-vacuum evaporation process. Such a composition distribution can provide band-gap grading by Ga distribution. However, Ga distribution as in Comparative Example 1 cannot provide the Ga-grading effect.

That is, it can be seen that the CIGS thin-film of Example 1 exhibited band-gap grading by adjusting the Ga distribution in the thin-film to a V-type distribution, thereby increasing operation efficiency of a solar cell, while simplifying process steps and shortening a process time, as compared with the conventional three-step co-vacuum evaporation process.

Although some embodiments have been described above, it should be understood that these embodiments are given by way of illustration only, and that various modifications, variations, and alterations can be made without departing from the spirit and scope of the present invention. The scope of the present invention should be limited only by the accompanying claims and equivalents thereof.

What is claimed is:

1. A method of fabricating a copper indium gallium selenide (CIGS) thin film for solar cells using a simplified co-evaporation in a vacuum process, the method comprising:

(a) depositing Cu, Ga and Se without In on a substrate having a substrate temperature ranging from 500° C. to 600° C. through co-evaporation in vacuum;

(b) depositing Cu, Ga, Se and In through co-evaporation in vacuum while maintaining the same substrate temperature as in step (a); and (c) depositing Ga and Se through co-evaporation in vacuum by blocking or stopped a supply of Cu and In for a selected time, followed by depositing Se alone through vacuum evaporation while lowering the temperature of the substrate.

2. The method according to claim 1, wherein, in step (a), the co-evaporation in vacuum is performed for 2 minutes to 15 minutes.

3. The method according to claim 1, wherein, in step (b), the co-evaporation in vacuum is performed for 8 minutes to 30 minutes.

4. The method according to claim 1, wherein, in step (c), co-evaporation in vacuum of Ga and Se is performed for 10 seconds to 180 seconds.

5. The method according to claim 1, wherein, in step (c), vacuum evaporation of Se alone is performed until the substrate temperature is lowered to 200° C.

6. A CIGS thin film for solar cells fabricated by the method according to claim 1.

7. A solar cell comprising the CIGS thin film for solar cells fabricated by the method according to claim 1.

\* \* \* \* \*